United States Patent [19]

Noufer

[11] Patent Number: 4,475,050
[45] Date of Patent: Oct. 2, 1984

[54] TTL TO CMOS INPUT BUFFER

[75] Inventor: Glenn E. Noufer, Colorado Springs, Colo.

[73] Assignee: Motorola, Inc., Schaumburg, Ill.

[21] Appl. No.: 491,675

[22] Filed: May 5, 1983

Related U.S. Application Data

[63] Continuation-in-part of Ser. No. 332,646, Dec. 21, 1981.

[51] Int. Cl.³ .................. H03K 17/10; H03K 19/094; H03K 19/20
[52] U.S. Cl. ................................ 307/475; 307/296 R; 307/354; 307/579
[58] Field of Search ............... 307/443, 451, 475, 530, 307/354, 362, 363, 242, 572, 579, 585, 264, 291, 307/296 R, 297, 279

[56] References Cited

U.S. PATENT DOCUMENTS

| | | | |
|---|---|---|---|
| 3,739,194 | 6/1973 | Freeman et al. | 307/296 R X |
| 3,975,649 | 8/1976 | Kawagoe et al. | 307/297 X |
| 4,023,050 | 5/1977 | Fox et al. | 307/475 X |
| 4,229,668 | 10/1980 | Ebihara et al. | 307/296 R X |
| 4,295,065 | 10/1981 | Hsieh et al. | 307/475 |
| 4,380,710 | 4/1973 | Cohen et al. | 307/475 |

OTHER PUBLICATIONS

Dingwall, "TTL-to-CMOS Buffer Circuit", *RCA Tech. Notes*, TN, No. 1114, Jun. 1975.

*Primary Examiner*—Larry N. Anagnos
*Assistant Examiner*—David R. Hudspeth
*Attorney, Agent, or Firm*—James L. Clingan, Jr.

[57] ABSTRACT

A CMOS level shifter with a reference voltage generator provides a TTL to CMOS input buffer. The reference voltage generator provides a reference voltage which is responsive to the voltage level of the TTL input signal. The reference voltage is kept sufficiently low to prevent an input P channel transistor from turning on when the TTL input signal is at a logic high even when the voltage level is at a minimum for a logic high.

4 Claims, 2 Drawing Figures

TTL TO CMOS INPUT BUFFER

CROSS REFERENCE TO A RELATED APPLICATION

This Application is a continuation-in-part of the following Application assigned to the assignee hereof:

U.S. Patent Application Ser. No. 332,646, entitled "TTL to CMOS Input Buffer", filed Dec. 21, 1981.

TECHNICAL FIELD

The invention relates to input buffers, and more particularly to low power input buffers which can level shift TTL inputs to CMOS levels.

BACKGROUND ART

In complementary metal oxide semiconductor (CMOS) technology a P channel insulated gate field effect transistor IGFET is in series with an N channel IGFET between a positive and a negative power supply terminal so that one of the two transistors is always off in a static condition to prevent current from flowing between the two power supply terminals in the static condition. Being able to detect a transistor transistor logic (TTL) output while keeping one of the P and N channel IGFETs off over the entire TTL output range is desirable in order to minimize power consumption. To conserve power is a typical reason for using CMOS. Because a TTL output can be as low as 2.0 volts for a logic high, there is difficulty ensuring the P channel IGFET if off while contemporaneously ensuring the N channel IGFET is on.

There are CMOS circuits which operate at different logic levels which are interfaced in a manner so that one of the N and P channel transistors is off. In such a case one set of logic circuits operates at a lower power supply voltage than that of another set of circuits, with the lower power supply voltage set of circuits providing an output which must be interfaced with the other set of circuits. A pair of inverters are coupled to a pair of cross-coupled amplifiers. The pair of inverters operate at the lower power supply voltage and provide an output which is coupled to the pair of cross-coupled amplifiers which operate at the higher power supply voltage. A key aspect of the operation is that each set of logic circuits provide signals which are rail to rail, i.e., a logic high is provided at or very near the positive power supply voltage, and a logic low is provided at or very near the negative power supply voltage.

In TTL circuits, however, that is not the case. Because a TTL logic high output can be as low as 2.0 volts with a 5 volt power supply, the TTL logic is not directly analogous to the lower power supply set of CMOS circuits. In the predecessor Application, U.S. Application Ser. No. 332,646 a separate reference voltage of a predetermined level was provided for the input inverters so that the P channel devices would not turn on even when the TTL input was only 2.0 volts. One problem with this approach is in the difficulty of providing the proper reference voltage over process variations.

BRIEF SUMMARY OF THE INVENTION

An object of the present invention is to provide an improved TTL to CMOS input buffer.

Another object of the invention is to provide an improved reference voltage generator for a TTL to CMOS input buffer.

Yet another object is to provide a TTL to CMOS input buffer which uses a reference voltage generator responsive to the voltage level of a TTL signal to provide a voltage to a pair of inverters of a CMOS levelshifter related to a voltage level of the TTL signal received on an input of the buffer.

The above and other objects and advantages of the present invention are achieved by a TTL to CMOS input buffer for providing an output signal in a first logic state when a TTL input signal is between a TTL supply voltage and a TTL reference voltage. The input buffer has a first transistor of a first conductivity type having a characteristic threshold voltage and having a control electrode for receiving the TTL signal, a first current electrode coupled to a reference terminal for receiving a CMOS reference voltage, and a second current electrode for providing a first output. A first transistor of a second conductivity type has a control electrode coupled to the control electrode of the first transistor of the first conductivity type, a first current electrode coupled to a first power supply terminal, and a second current electrode coupled to the second current electrode of the first transistor of the first conductivity type. A reference voltage generator is coupled to a second power supply terminal and the first power supply terminal and provides the CMOS reference voltage at a voltage which is substantially equal to the voltage level of the TTL input signal minus the threshold voltage of the first transistor of the first conductivity type when the TTL input signal is at a logic high and which is at a predetermined level when the TTL input signal is at a logic low.

DESCRIPTION OF A PREFERRED EMBODIMENT

Figure 1:
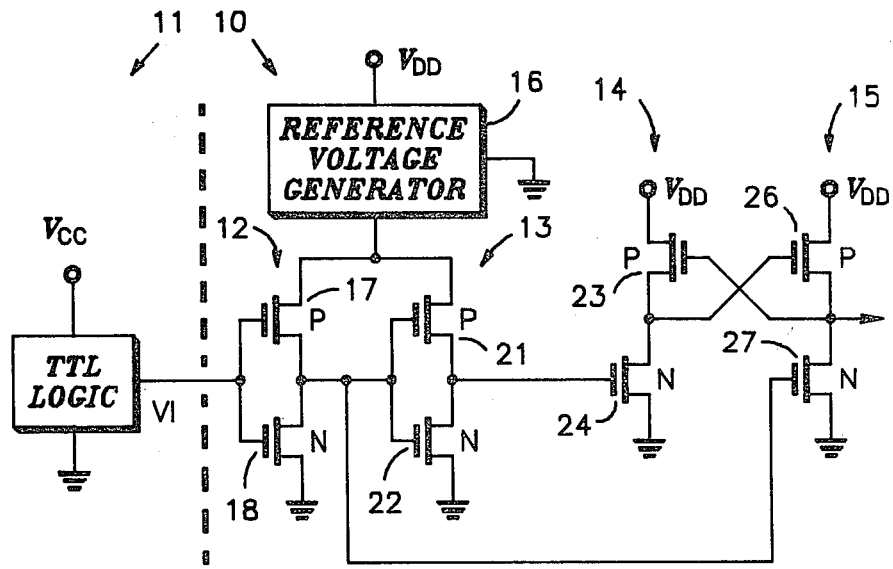
FIG. 1 is a circuit diagram of a TTL to CMOS input buffer according to a preferred embodiment of the present invention.

Shown in FIG. 1 is a TTL to CMOS input buffer 10 for providing an output in response to receiving a TTL signal from a TTL logic circuit 11 which is coupled between a TTL positive power supply voltage, shown as $V_{CC}$, and ground. Input buffer 10 comprises generally an inverter 12, an inverter 13, an amplifier 14, an amplifier 15 and a reference voltage generator 16. In the preferred embodiment N channel and P channel insulated gate field effect transistors are used. The N channel transistors have a characteristic threshold voltage of, for example, 0.4 to 0.8 volt. The P channel transistors have a characteristic threshold voltage of, for example, $-0.4$ to $-0.8$ volt.

Reference voltage generator 16 is connected to a positive power supply terminal $V_{DD}$, the voltage at which can be, for example, 5 volts, and to a negative power supply terminal, shown as ground. Reference voltage generator 16 provides a reference voltage VR at an output.

Inverter 12 comprises a P channel transistor 17 and an N channel transistor 18. Transistor 17 has a gate as an input of inverter 12 for receiving a TTL signal VI from TTL logic circuit 11, a drain for providing an output of inverter 12, and a source connected to the output of reference voltage generator 16. Transistor 18 has a gate connected to the gate of transistor 12, a drain connected to the drain of transistor 12, and a source connected to ground.

Inverter 13 comprises a P channel transistor 21 and an N channel transistor 22. Transistor 21 has a gate as an input of inverter 13 connected to the drain of transistor 17, a drain for providing an output of inverter 13, and a source connected to the output of reference voltage generator 16. Transistor 22 has a gate connected to the gate of transistor 21, a drain connected to the drain of transistor 21, and a source connected to ground.

Amplifier 14 comprises a P channel transistor 23 and an N channel transistor 24. Transistor 24 has a gate coupled to the drain of transistor 21, a source coupled to ground, and a drain for providing an output of amplifier 14. Transistor 23 has a source connected to $V_{DD}$, a drain connected to the drain of transistor 24, and a gate for receiving an output of amplifier 15.

Amplifier 15 comprises a P channel transistor 26 and an N channel transistor 27. Transistor 26 has a gate connected to the drain of transistor 24, a drain for providing the output of amplifier 15 and the output of input buffer 10 and which is connected to the gate of transistor 23, and a source connected to $V_{DD}$. Transistor 27 has a gate connected to the drain of transistor 17, a drain connected to the drain of transistor 26, and a source connected to ground.

Inverters 12 and 13 and cross-coupled amplifiers 14 and 15 are connected as a conventional CMOS level-shifter. A logic high on the input of inverter 12 causes transistor 18 to turn on so that the output of inverter 12 is at essentially ground which turns off transistors 22 and 27 and turns on transistor 21. Transistor 21 then couples the voltage on its source to the gate of transistor 24, turning transistor 24 sufficiently on so that its drain is at essentially ground, which in turn causes transistor 26 to turn on. A logic high is consequently supplied by the output of input buffer 10 at essentially $V_{DD}$. Conversely when a logic low is received on the input of inverter 12, transistor 17 turns on to provide a voltage on the output of inverter 12 which is essentially the voltage on the source of transistor 17. The output of inverter 12 then turns on transistor 27 so that the drain of transistor 27, which is also the output of input buffer 10, is at essentially ground. In addition, with transistor 17 on, transistor 22 will turn on causing the output of inverter 13 to be at essentially ground which will turn transistor 24 off. With the drain of transistor 27 at essentially ground transistor 23 will be on to provide essentially $V_{DD}$ to the drain of transistor 24 and the gate of transistor 26, so that transistor 26 is off.

This operation of a CMOS level-shifter ensures that one of the transistors in each of inverter 13, amplifier 14 and amplifier 15 will be off in a static condition. Consequently these three circuits do not provide a current path in a static condition. In conventional operation, inverter 12, as well as inverter 13, would have the same power supply connections as that of a CMOS circuit which generates a CMOS signal needing level shifting. A logic high would be at essentially the positive power supply voltage and a logic low would be at the negative power supply voltage so that one of transistors 17 and 18 would always be off in a static condition. In conventional operation, inverters 12 and 13 operate as output buffers providing true and complementary outputs to cross-coupled amplifiers 14 and 15, a level-shift interface actually being defined between the inverters and the cross-coupled amplifiers.

Operation of input buffer 10, however, defines an interface between TTL logic circuit 11 and inverter 12. TTL signal VI generated by TTL logic circuit 11 could be anywhere between 2.0 volts and $V_{CC}$, nominally 5 volts, and still be a logic high. If the source of transistor 17 was coupled to $V_{CC}$ when a logic high of 2.0 volts was received, both transistors 17 and 18 would be on, providing a power wasting current path. Consequently, reference voltage VR of reference voltage generator 16 is coupled to the source of transistor 17. Reference voltage VR is chosen so that transistor 17 will be off even when TTL signal VI is at the lowest voltage level for a logic high in this case 2.0 volts. In order to ensure that transistors 17 will be off, reference voltage VR must be less than the voltage level for a logic high minus the threshold voltage of transistor 17.

In choosing reference voltage VR, consideration must also be given to TTL signal VI in a logic low condition, which for TTL is between ground and 0.8 volts. Transistor 17 must be on when the TTL signal is at 0.8 volts. Accordingly, the voltage VR at the source of transistor 17 must be greater than 0.8 volts minus the threshold voltage of transistor 17. For reasons concerning speed, however, the voltage should be made as high as possible.

Figure 2:
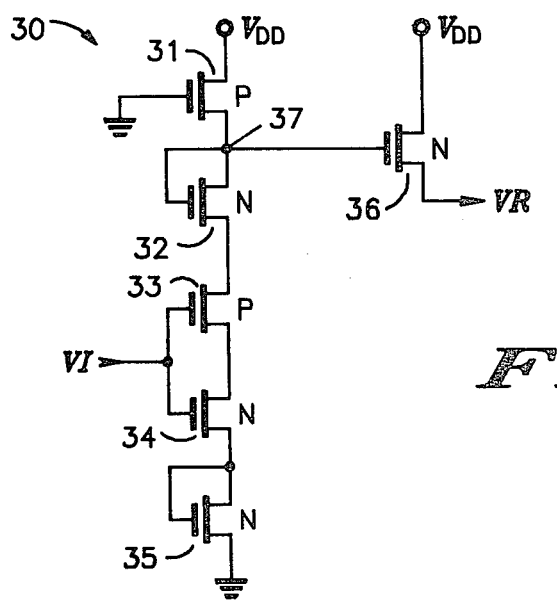
FIG. 2 is a circuit diagram of a reference voltage generator according to a preferred embodiment of the present invention.

Shown in FIG. 2 is a reference voltage generator 30 which is suitable for use as reference voltage generator 16 for input buffer 10 in FIG. 1. Generator 30 is comprised of a P channel transistor 31, an N channel transistor 32, a P channel transistor 33, an N channel transistor 34, an N channel transistor 35, and an N channel transistor 36.

Transistor 31 has a source connected to $V_{DD}$, a gate connected to ground, and a drain connected to a node 37. Transistor 32 has a gate and a drain connected to node 37, and a source. Transistor 33 has a source connected to the source of transistor 32, a gate for receiving TTL signal VI, and a drain. Transistor 34 has a drain connected to the drain of transistor 33, a gate for receiving TTL signal VI, and a source. Transistor 35 has a gate and a drain connected to the source of transistor 34, and a source connected to ground. Transistor 36 has a drain connected to $V_{DD}$, a gate connected to node 37, and a source for providing reference voltage VR for connection to the sources of transistors 17 and 21 of FIG. 1.

When TTL signal VI is at a logic high, transistor 34 and 35 will be turned on. Transistor 35 is diode-connected to cause an N channel threshold voltage drop. Transistor 34 will turn on when TTL signal VI exceeds two N channel threshold voltages. Because the maximum N channel threshold voltage is 0.8 volt, transistor 34 is ensured of being turned on even with the TTL signal being at the lowest logic high voltage of 2.0 volt.

Transistor 33 is the transistor which actually provides a voltage which is useful for providing reference voltage VR while transistor 34 is conducting. Transistor 33 is chosen to have sufficiently high gain so that the source of transistor 33 will be at a voltage which is not significantly higher than the voltage of the logic high signal VI minus a P channel transistor threshold voltage. Because the P channel transistors have a negative threshold voltage, the voltage on the source will be higher (more positive) than the voltage of signal VI. The amount higher will be by the magnitude of the P channel threshold voltage. Because transistor 32 is diode-connected, an N channel threshold voltage is added to the voltage on the source of transistor 33 to obtain the voltage on node 37. Transistor 31 is chosen to have a much smaller gain than transistors 32, 33, 34 and 35 so as to operate as a resistive or load device. Any suitable load device could also be used to replace transistor 31, for example, a depletion device or a polysilicon resistor.

As a source-follower, transistor 36 provides reference voltage VR at a voltage which is one N channel threshold voltage below the voltage at node 37. From the source of transistor 33 to node 37, one N channel threshold voltage is added. From node 37 to reference voltage VR, one N channel threshold voltage is subtracted. Accordingly, the reference voltage VR is supplied at the voltage present on the source of transistor 33 which in turn is the magnitude of one P channel threshold voltage above the voltage of signal VI. Consequently, the voltage on the source of transistor 17 of FIG. 1 is the magnitude of one P channel threshold voltage above the voltage of TTL signal VI received on the gate of transistor 17.

Although threshold voltages vary with process variations, ordinarily all transistors of a given type have the same threshold voltage on a given integrated circuit. The threshold voltage is primarily determined by doping concentration. To a significantly less extent, channel length, however, also effects threshold voltage. Increasing channel length increases the magnitude of the threshold voltage for N channel or P channel transistors. With reference voltage VR at the magnitude of the threshold voltage of transistor 33 above the voltage of signal VI would ordinarily imply that the gate to source voltage differential of transistor 17 of FIG. 1 would also be the magnitude of the threshold voltage of transistor 17. Accordingly, transistor 17 would be turned on to the same extent as transistor 33. The channel length of transistor 17, however, is made longer than that of transistor 33 so that the magnitude of the threshold voltage of transistor 17 is somewhat greater than that of transistor 33. Consequently, under the conditions described above, transistor 17 is either only slightly turned on or is turned off.

For the case where signal VI is a logic high at or near $V_{DD}$, transistor 33 will not turn on causing node 37 to be at $V_{DD}$. In which case reference voltage VR will be at an N channel threshold voltage below $V_{DD}$. With the signal VI at or near $V_{DD}$, transistor 17 will be safely off. The maximum voltage of reference voltage VR is $V_{DD}$ less an N channel threshold voltage.

For the case where signal VI is at a logic low, transistor 34 will be turned off because the maximum voltage of a logic low is 0.8 volt. The minimum N channel threshold voltage is 0.4 volt. So that even with a 0.8 volt logic low, the threshold voltage of transistor 34 will not be exceeded in view of diode-connected transistor 35. With transistor 34 turned off, there is no current path for transistor 31 so that node 37 reaches $V_{DD}$ which in turn causes reference voltage VR to be at $V_{DD}$ less an N channel threshold voltage. Although some current may flow through inverter 12 when signal VI is a logic low, such current is relatively small.

As noted previously, the actual desired voltage for reference voltage VR is generated on the source of transistor 33. Transistor 36 isolates the current for the operating circuit, inverters 12 and 13 of FIG. 1, from the actual reference generating portion of generator 30. Transistor 32 is interposed between the source of transistor 33 and node 37 to match the threshold voltage drop caused by source-follower transistor 36.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. In a TTL to CMOS input buffer, an input circuit for providing an output signal in a first logic state when a TTL input signal is between a TTL supply voltage and a TTL reference voltage, comprising:
   a first transistor of a first conductivity type having a characteristic threshold voltage and having a control electrode for receiving the TTL signal, a first current electrode coupled to a
   reference terminal for receiving a CMOS reference voltage, and a second current electrode for providing a first output;
   a first transistor of a second conductivity type having a control electrode coupled to the control electrode of the first transistor of the first conductivity type, a first current electrode coupled to a first power supply terminal, and a second current electrode coupled to the second current electrode of the first transistor of the first conductivity type;
   a second transistor of the second conductivity type having a first current electrode coupled to a second power supply terminal, a second current electrode for providing the CMOS reference voltage, and a control electrode coupled to a reference terminal;
   load means coupled between the second power supply terminal and the reference terminal for providing resistance therebetween;
   a third transistor of the second conductivity type having a first current electrode and a control electrode coupled to the reference terminal, and a second current electrode;
   a second transistor of the first conductivity type having a first current electrode coupled to the second current electrode of the third transistor of the second conductivity type, a control electrode for receiving the TTL input signal, and a second current electrode; and
   switch means coupled between the second current electrode of the second transistor of the first conductivity type and the first power supply terminal for providing a low resistance current path therebetween when the TTL signal is at a logic high and for blocking current flow therebetween when the TTL input signal is at a logic low.

2. The input circuit of claim 1, wherein the switch means comprises:
   a fourth transistor of the second conductivity type having a first current electrode coupled to the second current electrode of the second transistor of the first conductivity type, a control electrode for receiving the TTL input signal, and a second current electrode; and
   a fifth transistor of the second conductivity type having a first current electrode and a control electrode coupled to the second current electrode of the fourth transistor of the second conductivity type, and a second current electrode coupled to the first power supply terminal.

3. A reference voltage generator for providing a reference voltage which is responsive to a voltage level of an input signal at a logic high and which is at a predetermined voltage when the input signal is at a logic low, comprising:

load means coupled between a first power supply terminal and a reference node for providing resistance therebetween;

a first transistor having a first current electrode coupled to the reference node, a control electrode for receiving the input signal, and a second current electrode;

a second transistor having a first current electrode coupled to the second current electrode of the first transistor, a control electrode for receiving the input signal, and a second current electrode; and a third transistor having a control electrode and a first current electrode coupled to the second current electrode of the second transistor, and a second current electrode coupled to the second power supply terminal, wherein the second and third transistors are of a conductivity type opposite to that of the first transistor.

4. The reference voltage generator of claim 3, further comprising:

a fourth transistor interposed between the reference node and the first current electrode of the first transistor, and having a first current electrode and a control electrode coupled to the reference node, and a second current electrode coupled to the first current electrode of the first transistor; and a fifth transistor having a first current electrode coupled to the first power supply terminal, a control electrode coupled to the reference node, and a second current electrode for providing the reference voltage, wherein the fourth and fifth transistors are of a conductivity type opposite to that of the first transistor.

* * * * *